US009553164B2

(12) United States Patent
Huang et al.

(10) Patent No.: US 9,553,164 B2
(45) Date of Patent: Jan. 24, 2017

(54) METHOD FOR MANUFACTURING IGBT (71) Applicant: CSMC TECHNOLOGIES FAB1 CO., LTD., Jiangsu (CN)

(72) Inventors: Xuan Huang, Jiangsu (CN); Wanli Wang, Jiangsu (CN); Genyi Wang, Jiangsu (CN)

(73) Assignee: CSMC TECHNOLOGIES FAB1 CO., LTD., Jiangsu (CN)

( * ) Notice: Subject to any disclaimer, the term of this patent is extended or adjusted under 35 U.S.C. 154(b) by 0 days.

(21) Appl. No.: 14/902,205

(22) PCT Filed: Jun. 13, 2014

(86) PCT No.: PCT/CN2014/079820
§ 371 (c)(1),
(2) Date: Dec. 30, 2015

(87) PCT Pub. No.: WO2015/000355
PCT Pub. Date: Jan. 8, 2015

(65) Prior Publication Data
US 2016/0372570 A1 Dec. 22, 2016

(30) Foreign Application Priority Data
Jul. 3, 2013 (CN) .......................... 2013 1 0279389

(51) Int. Cl.
*H01L 21/00* (2006.01)
*H01L 29/66* (2006.01)
(Continued)

(52) U.S. Cl.
CPC ....... *H01L 29/66333* (2013.01); *H01L 21/304* (2013.01); *H01L 21/30604* (2013.01);
(Continued)

(58) Field of Classification Search
CPC ............. H01L 29/0804; H01L 29/4916; H01L 29/3171; H01L 29/7395
See application file for complete search history.

(56) References Cited

U.S. PATENT DOCUMENTS 5,072,287 A * 12/1991 Nakagawa ............ H01L 21/761
148/DIG. 12
5,463,241 A * 10/1995 Kubo ................... H01L 29/0653
257/139
7,936,014 B2    5/2011 Hsieh

FOREIGN PATENT DOCUMENTS

| CN | 103035961 A | 4/2013 |
| CN | 103137472 A | 6/2013 |
| CN | 103137474 A | 6/2013 |

OTHER PUBLICATIONS

International Search Report, PCT/CN2014/079820.

* cited by examiner

Primary Examiner — Richard Booth
(74) Attorney, Agent, or Firm — Polsinelli PC (57) ABSTRACT A method for manufacturing an IGBT, comprising: providing a substrate having a first surface and a second surface and of a first or second type of electrical conductance; forming grooves at intervals on the first surface of the substrate; filling a semiconductor material of the second or first type of electrical conductance into the grooves to form channels, where the type of electrical conductance of the channels is different from the type of electrical conductance of the substrate; bonding on the first surface of the substrate to form a drift region of the second type of electrical conductance; forming a front-side structure of the IGBT on the basis of the drift region; thinning the substrate starting from the second surface of the substrate until the channels are exposed; and forming a rear-side metal electrode on the channels and the thinned substrate. The method has no (Continued)

specific requirement with respect to sheet flow capacity, nor requires a double-sided exposure machine apparatus, is compatible with a conventional process, and has a simple process and high efficiency.

12 Claims, 8 Drawing Sheets (51) Int. Cl.
*H01L 29/10* (2006.01)
*H01L 21/304* (2006.01)
*H01L 21/306* (2006.01)
*H01L 29/08* (2006.01)
*H01L 29/49* (2006.01)
*H01L 23/31* (2006.01)
*H01L 29/739* (2006.01)

(52) U.S. Cl.
CPC .... *H01L 21/30625* (2013.01); *H01L 23/3171* (2013.01); *H01L 29/0804* (2013.01); *H01L 29/1004* (2013.01); *H01L 29/1095* (2013.01); *H01L 29/4916* (2013.01); *H01L 29/7395* (2013.01)

METHOD FOR MANUFACTURING IGBT

CROSS REFERENCE TO RELATED APPLICATIONS

This application is a national stage application (under 35 U.S.C. §371) of PCT/CN2014/079820, filed Jun. 13, 2014, which claims priority to Chinese Application No. 201310279389.3, filed Jul. 3, 2013, the contents of which are incorporated herein by reference in its entirety.

FIELD OF THE INVENTION

The present disclosure relates to the field of semiconductor design and manufacturing technology, and more particularly relates to a manufacturing method of an IGBT (Insulated Gate Bipolar Transistor).

BACKGROUND OF THE INVENTION

IGBT is a composite full-controlled type of voltage-driven power semiconductor device composed of BJT (Bi-polar Junction Transistor) and MOSFET (Metal-Oxide-Semiconductor-Field-Effect-Transistor), which combines the high input impedance characteristics of MOSFETs with the low-saturation-voltage capability of BJT. The IGBT exhibits the features of high frequency, simple control circuit, high current density, and low on-state voltage, such that it is widely applied to the power control field. In the real practice, the IGBT is rarely used as an independent device, especially under conditions of inductive load, the IGBT requires a fast recovery diode freewheeling. Therefore, the conventional insulated gate bipolar transistor products usually employs a FWD (freewheeling diode) connected in parallel to protect the IGBT. In order to save the cost, the FWD can be integrated into the IGBT chip, thus forming the IGBT with a built-in diode or a reverse conducting IGBT.

In manufacturing a conventional reverse conducting IGBT, an implantation window of the back side of the P+ collector region is formed by double-sided photoetching after grinding. However, this method has two main drawbacks: first, a wafer grinding flow capacity is required, especially for those common IGBTs under 1200V which have a thickness less than 200 µm; second, a double-sided exposure machine is required to expose the wafer. In addition, the conventional reverse conducting IGBT is manufactured by a backside double photolithography technique.

SUMMARY OF THE INVENTION

Accordingly, it is necessary to provide a manufacturing method of an IGBT, which has no special requirements for the wafer flow capacity, and does not require a double-sided exposure machine.

A method of manufacturing an IGBT includes: providing a substrate with a first conductivity type or a second conductivity type having a first surface and a second surface; defining a plurality of spaced grooves on the first surface of the substrate; filling the plurality of grooves with semiconductor material to form a plurality of channels, wherein the channels and the substrate have different conductivity types; forming a drift region with a second conductivity type by bonding on the first surface of the substrate; forming a front side structure of the IGBT on the basis of the drift region; grinding the substrate from the second surface thereof until the channels are exposed, then the channels and the ground substrate are spaced, interleaved arranged; and forming a back side metal electrode on the channels and the ground substrate, wherein the back side metal electrode is in electrical contact with the channels and the ground substrate.

In one embodiment, the substrate has a thickness ranging from 100 µm to 650 µm, and a resistivity ranging from 0.001 $\Omega$*cm to 100 $\Omega$*cm; the drift region formed by bonding has a thickness ranging from 10 µm to 650 µm, and a resistivity ranging from 5 $\Omega$*cm to 500 $\Omega$*cm; a sum of a thickness of the substrate and a thickness of the drift region formed by bonding equals to a thickness of a normal flowing silicon wafer.

In one embodiment, the normal flowing wafer is a six-inch silicon wafer having a thickness of 625 µm or 675 µm; or the normal flowing wafer is an eight-inch silicon wafer having a thickness of 725 µm.

In one embodiment, the plurality of spaced grooves are defined on the first surface of the substrate by a photolithography and etching process; the grooves have a depth ranging from 0.5 µm to 50 µm.

In one embodiment, after filling the semiconductor material with a second conductivity type or first conductivity type, the method further comprises: transforming the semiconductor material into monocrystalline silicon by a high-temperature process, and smoothing the first surface of the substrate by a chemical mechanical polishing (CMP) process.

In one embodiment, the front side structure of the IGBT includes: a base region with a first conductivity type selectively formed on an upper surface of the drift region; an emitter region with a second conductivity type selectively formed in the base region; a gate oxide layer located on the upper surface of the drift region; a polysilicon gate formed on an upper surface of the gate oxide layer; a dielectric layer covering the gate oxide layer and the polysilicon gate; a front side metal electrode electrically connected to the base region and the emitter region; and a passivation layer formed outside the front side metal electrode.

In one embodiment, the first conductivity type is P-type; the second conductivity type is N-type.

In the foregoing described manufacturing method for IGBT, the spaced collector region and channels on the back side of the IGBT are firstly formed, the front side structure of IGBT is then formed on the bonding drift region. After the formation of the front side structure is completed, only a grinding step and backside metallization step are needed, thus there are no special requirements for the wafer flow capacity, and a double-sided exposure machine is not required either.

BRIEF DESCRIPTION OF THE DRAWINGS

To illustrate the technical solutions according to the embodiments of the present invention or in the prior art more clearly, the accompanying drawings for describing the embodiments or the prior art are introduced briefly in the following. Apparently, the accompanying drawings in the following description are only some embodiments of the present invention, and persons of ordinary skill in the art can derive other drawings from the accompanying drawings without creative efforts.

DETAILED DESCRIPTION OF THE EMBODIMENTS

Reference will now be made to the drawings to describe, in detail, embodiments of the present disclosure. It should be noted that references to "an" or "one" embodiment in this disclosure are not necessarily to the same embodiment, and such references mean at least one.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively. Additionally, the words "herein," "above," "below" and words of similar import, when used in this application, shall refer to this application as a whole and not to any particular portions of this application. When the claims use the word "or" in reference to a list of two or more items, that word covers all of the following interpretations of the word: any of the items in the list, all of the items in the list and any combination of the items in the list.

Before describing the manufacturing method of an IGBT, it should be noted that a side where an emitter and a gate of the IGBT reside can usually be interpreted as the front side, while a side where a collector of the IGBT reside can usually be interpreted as the rear side.

Figure 1:
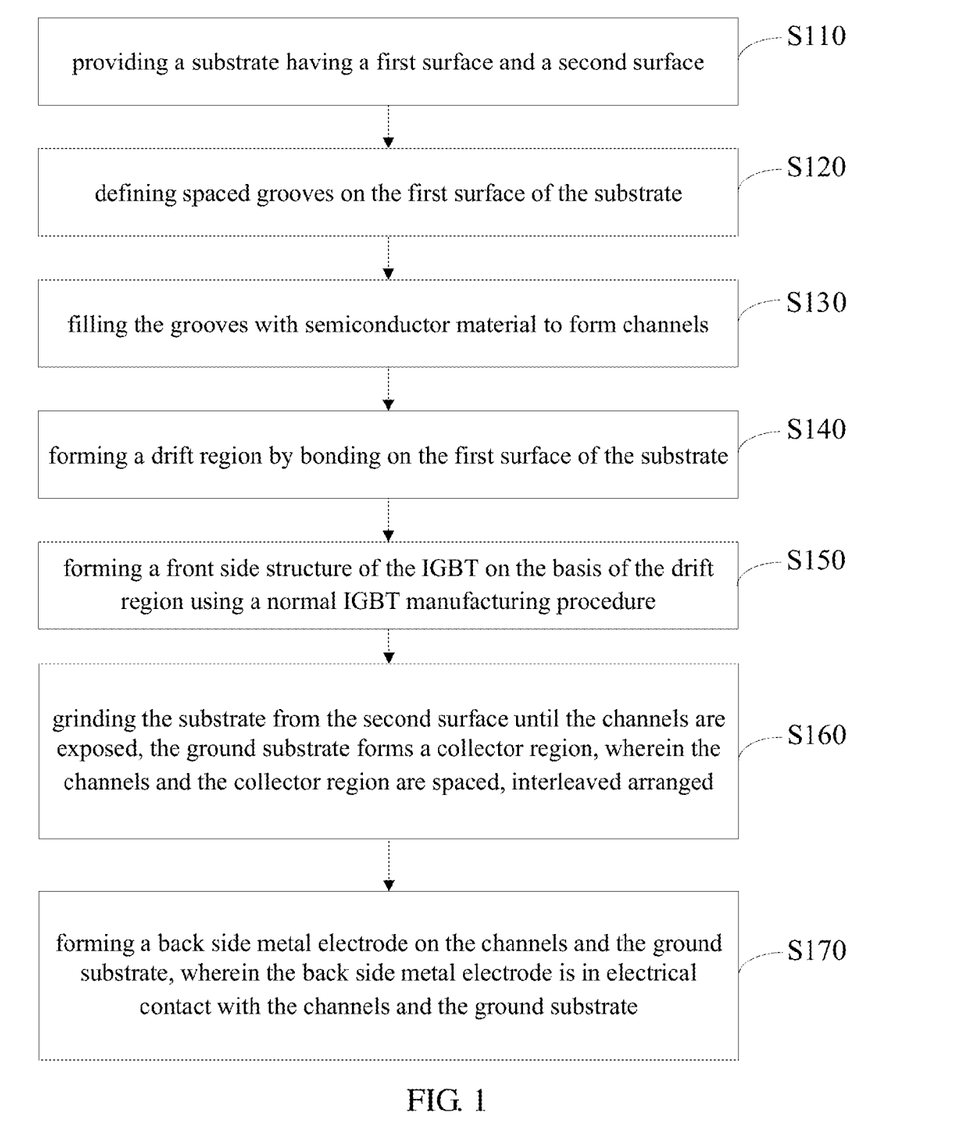
FIG. 1 is a flow chart of a method of manufacturing an IGBT in accordance with one embodiment.
Figure 2:
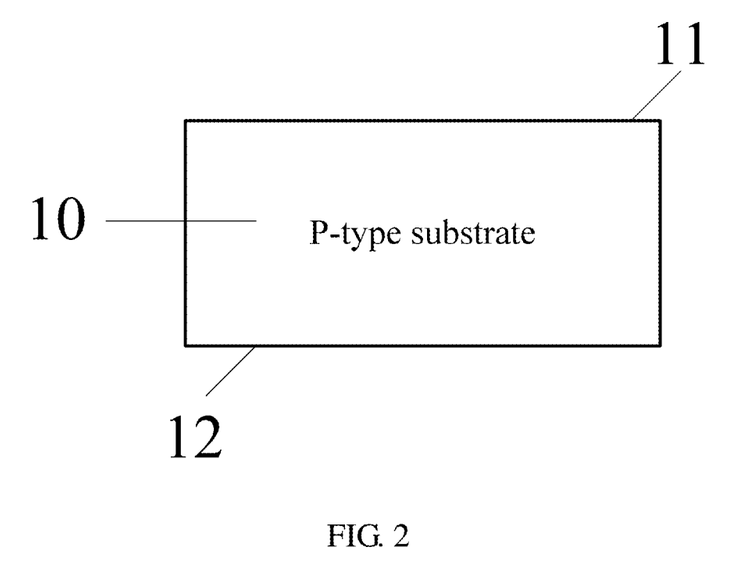
FIGS. 2 to 8 are longitudinal section views of each step in the method of manufacturing the IGBT of FIG. 1.

Referring to FIG. 1, in one embodiment, a method of manufacturing an IGBT includes the following steps:

In step S110, referring to FIG. 2, a P-type or N-type substrate 10 is provided, which has a first surface 11 and a second surface 12.

Specifically, the substrate 10 has a thickness ranging from 100 μm to 650 μm, and a resistivity ranging from 0.001 Ω*cm to 100 Ω*cm. The thickness of the substrate 10 is associated to a thickness of a bonding drift region described below.

Figure 3:
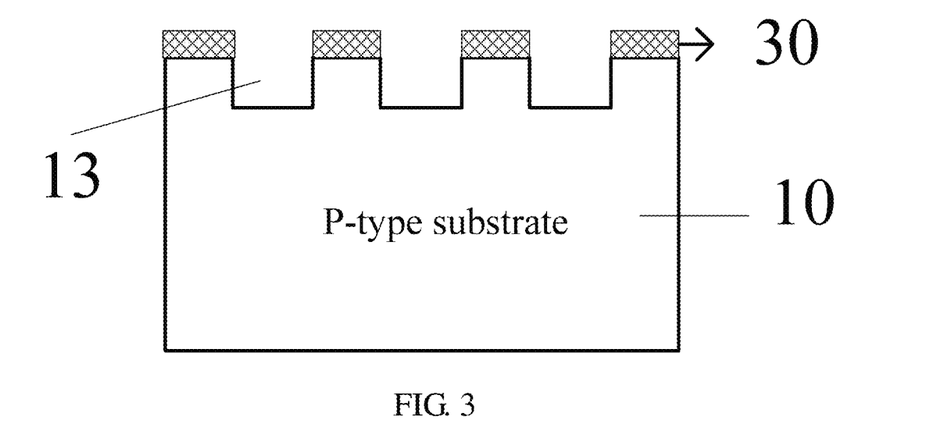

In step S120, referring to FIG. 3, a plurality of spaced grooves 13 are defined on the first surface 11 of the substrate 10 by a photolithography and etching process. Specifically, the grooves 13 have a depth ranging from 0.5 μm to 50 μm.

Figure 4:
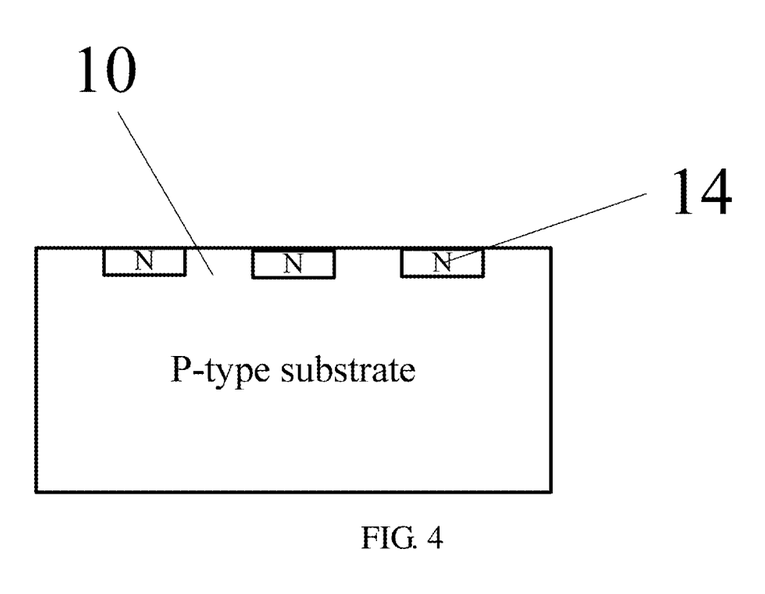

In step S130, referring to FIG. 4, the plurality of grooves 13 are filled with N-type or P-type semiconductor material to form a plurality of N-type or P-type channels 14.

When the substrate is P-type, the N-type channels are formed in the step S130; when the substrate is N-type, the P-type channels are formed in the step S130, in other words, the channels and the substrate have different conductivity types. In the illustrated embodiment shown in FIGS. 2 to 7, the substrate 10 is P-type, and the channels 14 are N-type. Specifically, referring to FIG. 3, N-type semiconductor materials (such as monocrystalline silicon, polycrystalline silicon, or amorphous silicon) are filled in the grooves 13, and the semiconductor materials are transformed into monocrystalline silicon by a high-temperature process, such that activated N-type channels 14 are obtained. The first surface 11 of the substrate 10 is smoothed by a chemical mechanical polishing (CMP) process. A photoresist 30 shown in FIG. 3 can be removed in an appropriate step.

In the conventional method, the activation of the N-type channel is performed after the formation of the front side metal electrode, however, in the present embodiment, the activation is performed prior to the formation of the front side metal electrode, such that the activation efficiency of the doping region (such as N-type channel 14) is increased.

Figure 5:
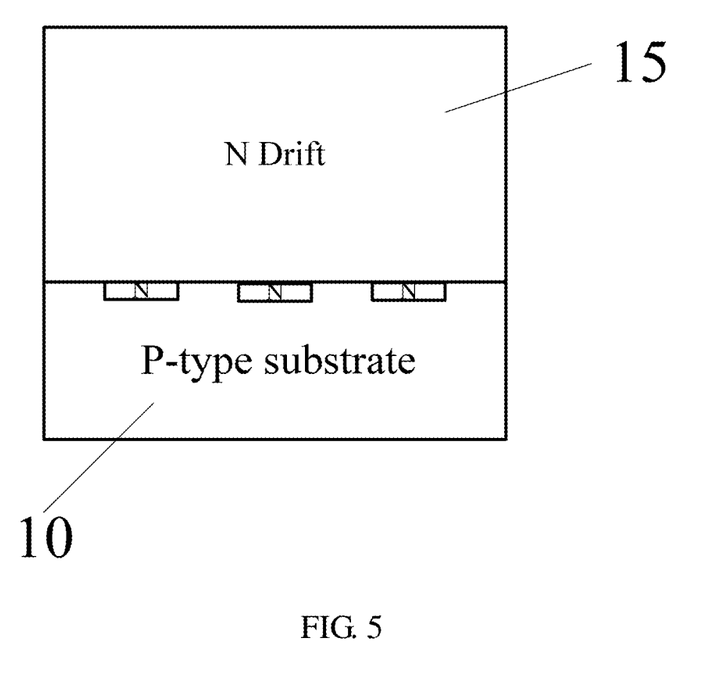

In step S140, referring to FIG. 5, an N-type drift region (N Drift) 15 is formed on the first surface 11 of the substrate 10 by bonding.

Specifically, the drift region 15 formed by bonding has a thickness of 10 μm to 650 μm, and a resistivity of 5 Ω*cm to 500 Ω*cm. The thickness of the drift region 15 is associated to the thickness of substrate 10. A sum of the thickness of the substrate 10 and the thickness of the drift region 15 formed by bonding equals to a thickness of a normal flowing silicon wafer, such as a six-inch silicon wafer having a thickness of 625 μm or 675 μm; or an eight-inch silicon wafer having a thickness of 725 μm.

Figure 6:
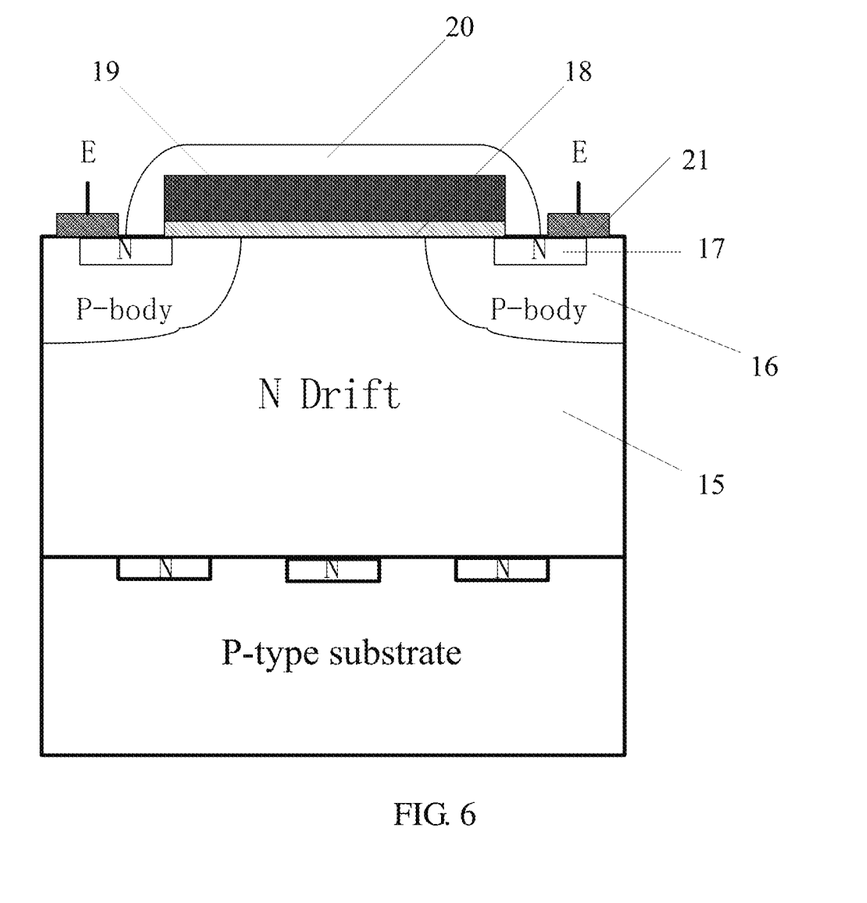

In step S150, referring to FIG. 6, a front side structure of the IGBT is formed on the basis of the drift region 15 using a normal IGBT manufacturing procedure.

FIG. 6 illustrates a front structure of a planar IGBT. The front structure of the IGBT includes: a P-type base region (P-body) 16 selectively formed on an upper surface of the drift region 15; an N-type emitter region 17 selectively formed in the P-type base region 16; a gate oxide layer 18 located on the upper surface of the drift region 15; a polysilicon gate (G) 19 formed on the gate oxide layer 18; a dielectric layer 20 covering the gate oxide layer 18 and the polysilicon gate 19; and a front side metal electrode 21 (i.e. emitter E) electrically connected to the P-type base region 16 and the N-type emitter region 17.

FIG. 6 schematically illustrates the front side metal electrode 21. In fact, the front side metal electrode 21 can cover the whole dielectric layer 20. In addition, the front structure of the IGBT can further include a passivation layer (such as silicon dioxide or silicon nitride) formed outside the front side metal electrode 21.

In alternative embodiment, a trench IGBT having a different front structure from that shown in FIG. 6 can be manufactured. Since the trench IGBT is well-known in the art, there is no need to describe the front structure thereof again. It should be noted that, from a certain point of view, which specific front structure of IGBT is employed is not particularly concerned in the present invention, as long as the front structure can be applied to the IGBT devices.

From another perspective, the front structure of the IGBT is not the main focus of the present invention, which can be manufactured according to various methods known in the art, therefore, in order to highlight the focus of the present invention, the specific manufacturing method of the front structure of the IGBT will not be described in greater details herein.

Figure 7:
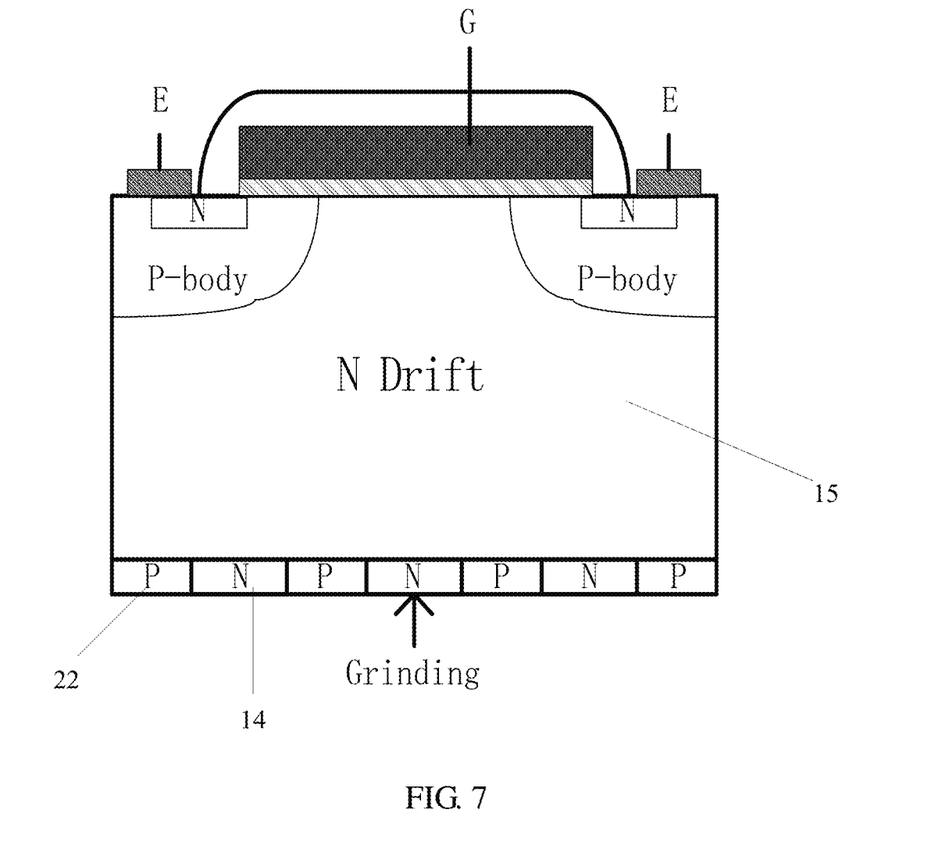

In step S160, referring to FIG. 7, the substrate 10 is ground from the second surface thereof until the channels 14 are exposed, then the channels 14 and the ground substrate 22 are spaced, interleaved arranged.

When the substrate 10 is P-type, the ground substrate 22 forms a P-type collector region, the N-type channels 14 forms a N-type cathode region; when the substrate 10 is N-type, the N-type channels 14 forms a P-type collector region, the ground substrate 22 forms a N-type cathode region. The N-type cathode region, the N-type drift region 15, and the P-type base region 16 cooperatively form a PIN (positive intrinsic negative diode) reverse diode, thus the IGBT of the present invention can be regarded as a reverse conducting IGBT.

Specifically, a grinding technique can be used to grind the substrate 10.

Figure 8:
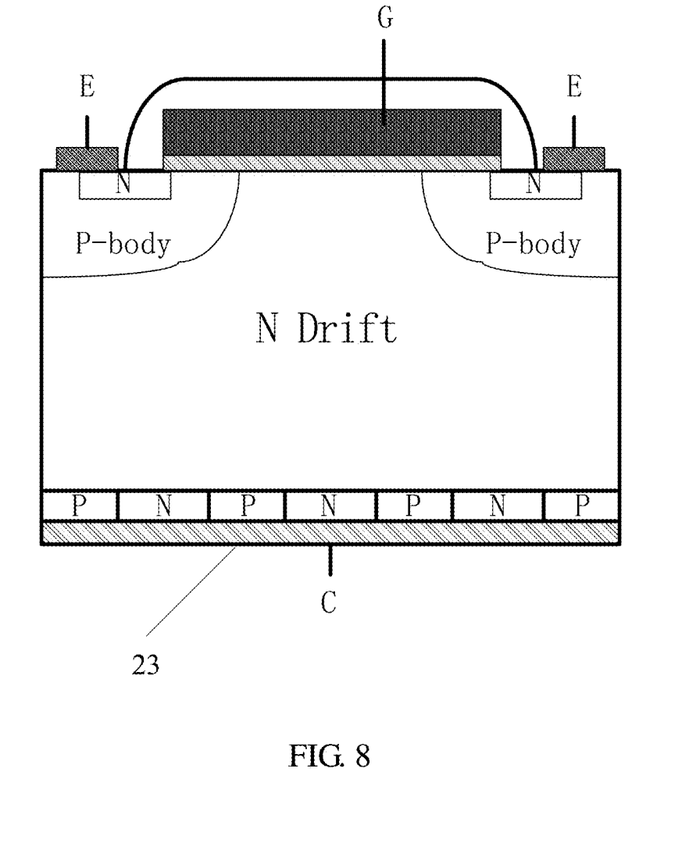

In step S170, referring to FIG. 8, a back side metal electrode (collector C) 23 is formed outside the channels 14 and the ground substrate 22 by sputtering or evaporation, and the back side metal electrode 23 is in electrical contact with the channels 14 and the ground substrate 23.

It should be understood for the person skilled in the art that, one of the features or purposes of the present invention is: the formation of the spaced P-type collector region and N-type channels on the back side of the IGBT are firstly completed, the front side structure of IGBT is then formed on the bonding drift region 15. After the formation of the front side structure is completed, only a grinding step and backside metallization step are needed, thus there are no special requirements for the wafer flow capacity, and a double-sided exposure machine is not required either.

In the above-described embodiments, the P-type can be regarded the first conductivity type, the N-type can be regarded as the second conductivity type. In alternative embodiments, all of the P-type regions in the above-described embodiments, such as P-type base region, P-type collector region, can be altered to the N-type; while all of the N-type regions, such as N-type drift region, N-type emitter region, N-type cathode region, can be altered to the P-type; in that case, the first conductivity type is N-type, and the second conductivity type can be P-type.

Although the present invention has been described with reference to the embodiments thereof and the best modes for carrying out the present invention, it is apparent to those skilled in the art that a variety of modifications and changes may be made without departing from the scope of the present invention, which is intended to be defined by the appended claims.

What is claimed is:

1. A method of manufacturing an IGBT (Insulated Gate Bipolar Transistor), comprising:
   providing a substrate having a first surface and a second surface;
   defining a plurality of spaced grooves on the first surface of the substrate;
   filling the plurality of grooves with semiconductor material to form a plurality of channels, wherein the channels and the substrate have different conductivity types;
   forming a drift region by bonding on the first surface of the substrate;
   forming a front side structure of the IGBT on the basis of the drift region;
   grinding the substrate from the second surface thereof until the channels are exposed, then the channels and the ground substrate are spaced, interleaved arranged; and
   forming a back side metal electrode on the channels and the ground substrate, wherein the back side metal electrode is in electrical contact with the channels and the ground substrate.

2. The method of manufacturing the IGBT according to claim 1, wherein the substrate has a thickness ranging from 100 μm to 650 μm, and a resistivity ranging from 0.001 Ω*cm to 100 Ω*cm.

3. The method of manufacturing the IGBT according to claim 1, wherein the drift region formed by bonding has a thickness ranging from 10 μm to 650 μm, and a resistivity ranging from 5 Ω*cm to 500 Ω*cm.

4. The method of manufacturing the IGBT according to claim 1, wherein a sum of a thickness of the substrate and a thickness of the drift region formed by bonding equals to a thickness of a normal flowing silicon wafer.

5. The method of manufacturing the IGBT according to claim 4, wherein the normal flowing wafer is a six-inch silicon wafer having a thickness of 625 μm or 675 μm; or the normal flowing wafer is an eight-inch silicon wafer having a thickness of 725 μm.

6. The method of manufacturing the IGBT according to claim 1, wherein the plurality of spaced grooves are defined on the first surface of the substrate by a photolithography and etching process.

7. The method of manufacturing the IGBT according to claim 6, wherein the grooves have a depth ranging from 0.5 μm to 50 μm.

8. The method of manufacturing the IGBT according to claim 6, wherein after filling the semiconductor material with a second conductivity type or first conductivity type, the method further comprises: transforming the semiconductor material into monocrystalline silicon by a high-temperature process, and smoothing the first surface of the substrate by a chemical mechanical polishing process.

9. The method of manufacturing the IGBT according to claim 1, wherein the front side structure of the IGBT comprises:
   a base region with a first conductivity type selectively formed on an upper surface of the drift region;
   an emitter region with a second conductivity type selectively formed in the base region;
   a gate oxide layer located on the upper surface of the drift region;
   a polysilicon gate formed on an upper surface of the gate oxide layer;
   a dielectric layer covering the gate oxide layer and the polysilicon gate; and
   a front side metal electrode electrically connected to the base region and the emitter region.

10. The method of manufacturing the IGBT according to claim 9, wherein the front side structure of the IGBT further comprises a passivation layer formed outside the front side metal electrode.

11. The method of manufacturing the IGBT according to claim 1, wherein the first conductivity type is P-type; the second conductivity type is N-type.

12. The method of manufacturing the IGBT according to claim 1, wherein the drift region is of N-type.

* * * * *